(12) United States Patent
Paryani et al.

(10) Patent No.: US 12,054,064 B2
(45) Date of Patent: Aug. 6, 2024

(54) COMBINED BMS, CHARGER, AND DC-DC IN ELECTRIC VEHICLES

(71) Applicant: Auto Motive Power Inc., Santa Fe Springs, CA (US)

(72) Inventors: Anil Paryani, Cerritos, CA (US); Mike Hibbard, Long Beach, CA (US); Vardan Markosyan, Sunland, CA (US); Jana Fernando, Torrance, CA (US); Jacob Swanson, Los Angeles, CA (US); Warren Chan, Santa Ana, CA (US); Joel Karlsson, Pomona, CA (US); Edward Casilio, Torrance, CA (US)

(73) Assignee: Ford Global Technologies LLC, Dearborn, MI (US)

( * ) Notice: Subject to any disclaimer, the term of this patent is extended or adjusted under 35 U.S.C. 154(b) by 0 days.

(21) Appl. No.: 17/873,533

(22) Filed: Jul. 26, 2022

(65) Prior Publication Data

US 2022/0355694 A1    Nov. 10, 2022

Related U.S. Application Data

(63) Continuation of application No. 16/813,290, filed on Mar. 9, 2020, now Pat. No. 11,458,856.
(Continued)

(51) Int. Cl.
*B60L 53/60* (2019.01)
*B60L 3/00* (2019.01)
(Continued)

(52) U.S. Cl.
CPC ............. *B60L 53/60* (2019.02); *B60L 3/0046* (2013.01); *B60L 3/04* (2013.01); *B60L 53/20* (2019.02);
(Continued)

(58) Field of Classification Search
CPC ............... B60L 2240/525; B60L 53/22; H05K 7/20927; H05K 7/2089; H05K 7/20936; H02M 7/003
See application file for complete search history.

(56) References Cited

U.S. PATENT DOCUMENTS

2004/0022041 A1* 2/2004 Bergmann ............ H02M 7/003
361/784
2014/0216058 A1* 8/2014 Tsuboi .................... H01L 23/38
62/3.2
(Continued)

FOREIGN PATENT DOCUMENTS

CN    107404833 A  * 11/2017
GB      2520556 A     5/2015
(Continued)

*Primary Examiner* — Ryan Johnson
(74) *Attorney, Agent, or Firm* — Enable IP P.C.

(57) ABSTRACT

A combined battery management system, charger, and direct current converter (BCD) for an electric vehicle is disclosed. The combined unit includes an enclosure enclosing: an on board charger (OBC); a direct current converter (DC-DC); and a single cold plate thermally coupled to both the OBC and the DC-DC, the single cold plate configured to provide cooling for both the OBC and the DC-DC. The combined unit also includes a plurality of 12V terminal posts on the enclosure, at least one of the plurality of 12V terminal posts for 12V in and at least two of the plurality of 12V terminal posts for 12V outs.

13 Claims, 7 Drawing Sheets

Related U.S. Application Data (60) Provisional application No. 62/816,054, filed on Mar. 8, 2019.

(51) Int. Cl.

| | |
|---|---|
| *B60L 3/04* | (2006.01) |
| *B60L 53/20* | (2019.01) |
| *B60L 53/22* | (2019.01) |
| *B60L 58/18* | (2019.01) |
| *B60L 58/20* | (2019.01) |
| *G01R 31/52* | (2020.01) |
| *H01M 10/42* | (2006.01) |
| *H05K 7/20* | (2006.01) |

(52) U.S. Cl.
CPC ............... *B60L 53/22* (2019.02); *B60L 58/18* (2019.02); *B60L 58/20* (2019.02); *G01R 31/52* (2020.01); *H05K 7/20927* (2013.01); *B60L 2210/10* (2013.01); *B60L 2240/525* (2013.01); *H01M 2010/4271* (2013.01); *Y02T 10/70* (2013.01); *Y02T 10/7072* (2013.01)

(56) References Cited

U.S. PATENT DOCUMENTS

| | | | |
|---|---|---|---|
| 2017/0127540 A1* | 5/2017 | You | H05K 9/0007 |
| 2019/0111866 A1* | 4/2019 | Ito | B60R 16/0215 |
| 2020/0014240 A1 | 1/2020 | Boesch | |
| 2021/0016674 A1* | 1/2021 | Ezaki | H02J 7/0068 |

FOREIGN PATENT DOCUMENTS

| | | | | |
|---|---|---|---|---|
| JP | 2013247817 A | * | 12/2013 | ......... B60L 11/1812 |
| JP | 2015115515 A | * | 6/2015 | |
| JP | 2017136982 A | | 8/2017 | |
| KR | 20170014067 A | * | 2/2017 | |
| WO | WO-2011141785 A1 | * | 11/2011 | ......... B60L 11/1812 |

* cited by examiner

COMBINED BMS, CHARGER, AND DC-DC IN ELECTRIC VEHICLES

CROSS REFERENCE TO RELATED APPLICATIONS

This application claims priority to U.S. patent application Ser. No. 16/813,290, filed on Mar. 9, 2020, and U.S. Provisional Patent Application Ser. No. 62/816,054, filed on Mar. 8, 2019, the disclosure of which is hereby incorporated by reference in its entirety.

FIELD OF THE INVENTION

This relates to systems for electric vehicles and, more specifically, to a combined Battery Management System (BMS)/Charger/Direct Current Converter (DC-DC).

BACKGROUND OF THE INVENTION

The advent of mainstream electric vehicle and e-mobility application (like vertical take-off and landing (VTOL) helicopters and e-bikes) adoption requires a fresh perspective regarding the architecture of the electrical power system. Previous attempts at electric vehicles have resulted in sourcing individual electrical components that provide specific functionality and are distributed across the vehicle. The attempt from suppliers of electrical components has been to produce a generic component to be used across multiple vehicle lines in order to reduce cost through economies of scale. This disclosure provides a solution of reducing non-recurring engineering (NRE) and bill of material (BOM) cost, volume and mass through integration of individual components while providing added features.

DETAILED DESCRIPTION

I. Acronyms and Definitions

BMS—Battery Management System
BOM—Bill of Materials
Contactor—mechanical or solid-state switch electrically isolating connection point(s)
DC-DC—Direct Current Converter
IBS—Intelligent Battery Sensor for the LV BMS function
LV or LVB—Low Voltage battery or system. Typically, in automotive, 12V, 14V, 16V, 24V, 42V, 48V, but not so limited
HV or HVB—High Voltage battery or system
isoSPI—isolated communications typically used for HV battery cell voltage and temperature measurements
NRE—Non-Recurring Engineering
OBC—On Board Charger and/or wireless charger
BCD—Combined BMS/Charger/DC-DC (the term "ampBCD" refers to an embodiment of the BCD in the present disclosure)
PTC—Power Train Controller to determine motor torque to 1 or more motors in the system
V and T—Voltage and Temperature measurements
SOC—State of Charge
CAN—Controller Area network
ASIC—application-specific integrated circuit
FET—Field Effect Transistor
IGBT—insulated-gate bipolar transistor
SPI—Serial Peripheral Interface
HVIL—High Voltage Interlock Loop

II. HV Architectures May Contain One or More of the Following Components

1. The high voltage distribution box (ISO15118/GBT charging controller, fast charge contactor control)
2. High-voltage BMS
3. Low-voltage BMS typically required if redundant 12V (or other LV) is needed
4. On Board Charger—
5. DC-DC 1 typically required if redundant 12V (or other LV) is needed
6. Powertrain Controller
7. Smart Fuse Box
8. 12V (or other LV) Battery contained in BCD In this document, the term "12V" is not limited to a 12V battery, but is representative of any LV.

Embodiments of this disclosure combine these systems, which also adds several new features so the following benefits can be realized as described in the table below. Since the components are integrated into a single unit, much of the harnessing required (both HV and LV) is reduced significantly as these connections can be made via internal bus bars or PCB traces depending on the power requirements. Furthermore, safety and reliability can be increased with a reduction of the amount of external connections between individual components. A subset of combinations can also be realized in other embodiments of the disclosure. Notice how the disclosed embodiments have virtually eliminated one junction box in the vehicle from the diagram in the table below.

TABLE 1

Traditional vs BCD architecture

Figure 10A:
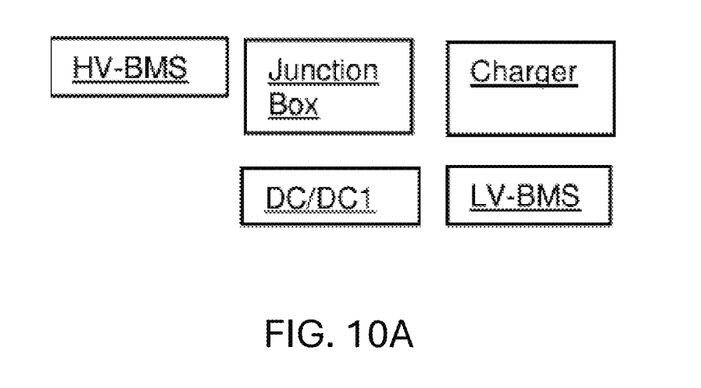
FIGS. 10A and 10B illustrate traditional and BCD architectures, respectively.
Figure 10B:
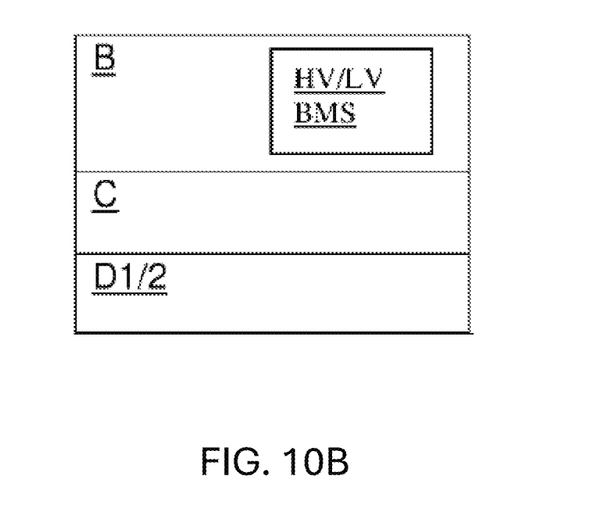

| | Traditional | BCD |
|---|---|---|
| Architecture | Shown in FIG. 10A Optional 12 V battery and Smart Fuse box in addition to those pictures. | Shown in FIG. 10B D1/2 |
| Volume | | Reduced by up to 50% |
| Mass | | 20% to 50% less by reducing heatsinking and multiple housing needs |
| Cost | | 20 to 50% Less |
| Development Time | | Up to 50% less |
| NRE | | 20 to 50% Less |
| Redundant 12 V | Needs additional DC-DC | Inherent |
| Maximize drive power without over-discharging cells | No | Yes by directly monitoring HV battery current |
| Current Sensor | CAN based | Lower cost SPI based or direct analog measurement |

III. System

Figure 1:
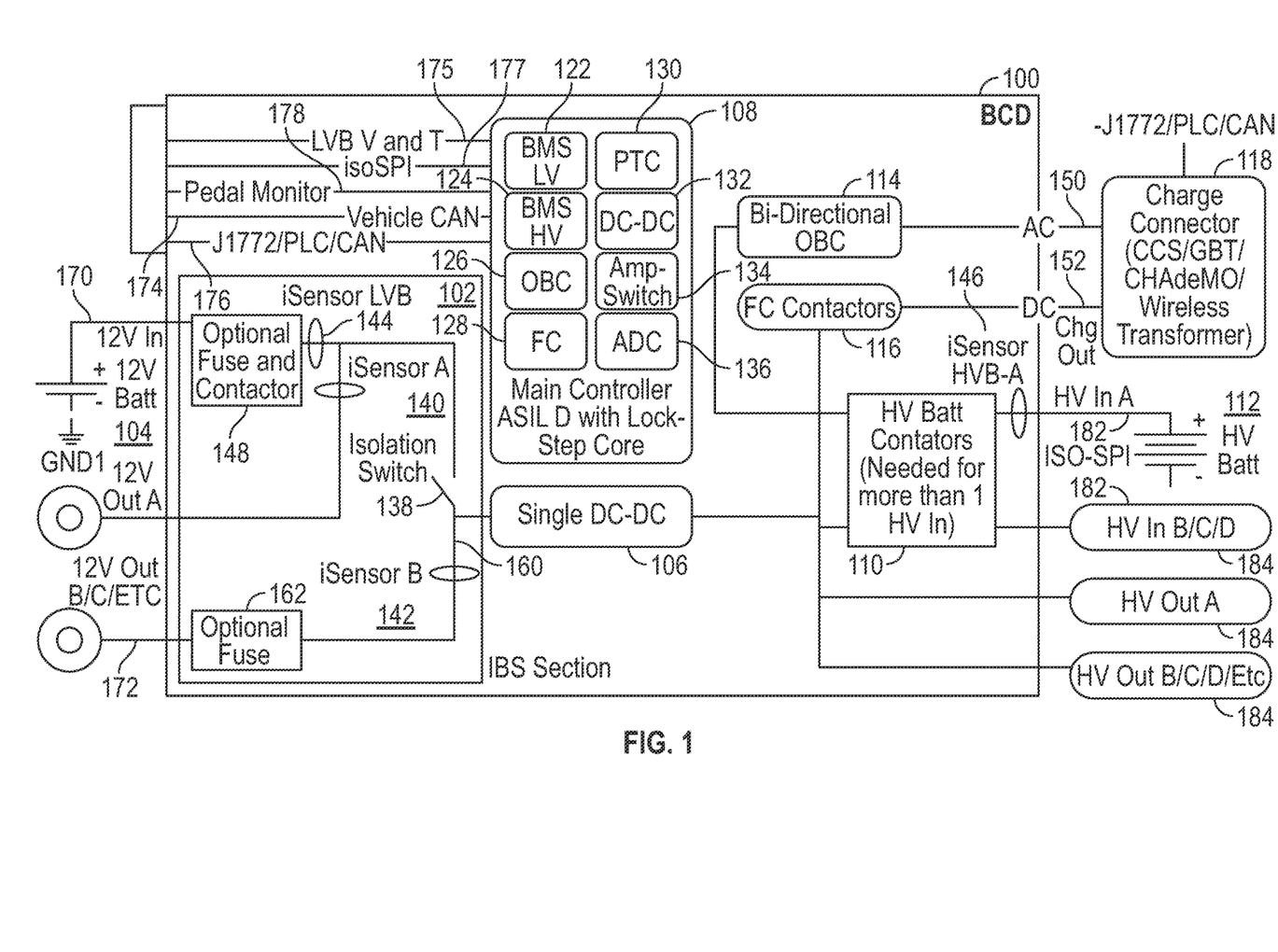
FIG. 1 is an electrical diagram of the BCD, according to an embodiment of the disclosure.

Described below, with reference to FIG. 1, is an embodiment of the disclosed BCD system 100 with a number of components. As illustrated, the BCD 100 of FIG. 1 can include a LV sensor (or "Sensor LVB") 102 connected to a LV (e.g., the 12V battery 104 as shown in FIG. 1), a single DC-DC 106, a main controller 108, a HV battery contactors 110 connected to a HV 112 (not part the BCD 100), a bi-directional OBC 114, and FC contactors 116. The bi-directional OBC 114 and the FC contactors 116 are connected to a charge connector 118 external to the BCD 100 via AC 150 and DC 152 connections, respectively. The charge connector 118 can, for example, be one of a combined charging system (CCS), GB/T, CHAdeMO, and a wireless transformer. The bi-directional OBC 114 and the FC contactors 116 are also connected to the HV 112 via the HV Battery contactors 110. The single DC-DC 106 connects the LV sensor 102 with the HV battery contactors 110 and the FC connectors 116.

The LV sensor 102 can include multiple iSensors 140, 142, 144 on various locations of the electric paths as shown in FIG. 1. The LV sensor 102 can also include an isolation switch 138 can connect and disconnect one of the out connections 160 to the LV (12V) 104. The out connection can include an optional fuse 162. The LV sensor can also include an optional fuse and contactor 148 connecting to the in connection of the LV (12V) 104. The exemplary functions of the above-listed components of the BCD 100 will be described below in Table 3.

The main controller 108 includes various modules including a LVBMS 122, a HVBMS 124, an OBC 126, FC 128, PTC 130, DC-DC 132, Amp-switch 134, and analog-to-digital converter (ADC) 136. The LVBMS 122 manages the LV 104. These modules of the main controller 108 can be implemented in firmware, hardware, or both, and are in communication with the components of the BCD that are under their respective control and/or management. The exemplary functions of each of these modules are discussed in Table 4 below.

In some embodiments, some of the components can be optionally and excluded from the BCD 100. For example, the HVBMS 124 or the PTC (Powertrain Controller) 130 may live elsewhere in the vehicle system. Also, note that the bi-directional OBC (On Board Charger) 114 can be uni-directional depending on user requirements. Some users, who do not care about autonomous Level 3+ requirements, may not need the ampSwitch. Also, note multiple HV out connections (collectively as 130) can be made to other HV components not included in the disclosed embodiments of BCD 100, like the drive inverter or PTC heater (not shown in FIG. 1).

For the LV (12V) side, there can be up to 4 legs of current flow. The BCD 100 only needs 3 current sensors (e.g., iSensor A 140, iSensor B 142, iSensor HVB-A 146) at arbitrary locations per Kirchhoff's law. The ampSwitch 134 can live on its own (e.g., outside of the BCD 100). It should be noted that fuses can be optional. This is dependent on the failure mode of the LV (12V) battery.

IV. Electrical

Consolidation of the high-level power controllers enumerated above yields cost, weight, and volumetric efficiencies. Electromagnetic interference filter (EMI) filtering components, power supply components, FR4 and other Printed Circuit Board Assembly (PCBA) materials, connectors, processors, and processor peripheral devices are shared between the different controllers such that the system in total contains fewer of these components. Additionally, the reduction of PCBA systems reduces total system labor and production overhead such as end of line testing and conformal coating.

The electrical diagram has the following I/O:

TABLE 2

Electrical Inputs and Outputs

| Electrical Connection | Purpose |
|---|---|
| 12 V In 170 | To be able to manage the low voltage battery |
| 12 V Out(s) 172 | 12 V Output source A, B, C . . . |
| Vehicle CAN 174 | Communication to the vehicle |
| J1772/PLC/CAN 176 | Communication to the charger |
| Pedal Monitor 178 | Direct high-speed communications to the pedal. This could be analog or SPI communications that monitor the accelerator and brake pedal |
| AC/DC 150, 152 | Power transfer to connector |
| HV In(s) 182 | High voltage battery input(s) |
| HV Out(s) 184 | High voltage battery output for the drive inverters, PTC Heater, heating, ventilation, and air conditioning (HVAC), wireless charger etc. |

The internal components are described in the table below:

TABLE 3

Electrical Hardware

| Electrical Hardware Components | Purpose |
|---|---|
| iSensor LVB 102 | To be able to measure current of the LV battery 104 for the following purposes: 1. SOC estimation of the LV battery 104 2. Safety protection of 12 V 104 to detect short circuit via a hardware comparator circuit 3. Charge and discharge manager of LV battery 104 to maximize life |

TABLE 3-continued

Electrical Hardware

| Electrical Hardware Components | Purpose |
|---|---|
| | Ideally this is a shunt, because it can be thermally managed and packaged better. This can be a hall-effect or flux gate in some lower current applications (<500 A). |
| iSensor A 140 | To detect a short-circuit failure of the 12 V A bus. This can be a hall-effect or flux gate in some lower current applications (<500 A). |
| iSensor B 142 | To detect a short circuit failure of the 12 V B bus. This can be a hall-effect or flux gate in some lower current applications (<500 A). |
| ISensor HVB 146 | To be able to measure current of the HV battery for the following purposes:<br>1. SOC estimation of the HV battery 104<br>2. Safety protection of short circuit via a hardware comparator circuit.<br>Ideally this is a shunt, because it can be thermally managed and packaged better. This can be a hall-effect or flux gate in some lower current applications (<500 A). |
| ampSwitch (HW Component) 134 | A solid-state switch comprised of back-to-back FETs. SiC can be used. If the hardware circuits of the iSensor A, B or LVB 140, 142, 146 detect a short circuit, this switch will open. Only the micro-controller can reclose the switch after it verifies the short circuit condition has gone away (see FW section). |
| J1772/PLC/CAN 118 | Communication to the charger. J1772/PLC is used in the US and Europe. CAN is used via the GBT and CHAdeMO standards in Asia |
| Bi-Directional | This could be uni-directional as well. It is typically 3 to 19 KW of power. The core can drive the |
| OBC 114 | gates of the OBC either digitally or via power electronic control ASICs. |
| FC Contactors 116 | Fast Charge contactors which function to prevent exposing HV to the Connector pins when not plugged in |
| Single DC-DC 106 | Charges the 12 V battery 104 from the HV battery 112 |
| LVB V and T 175 | Voltage and temperature readings from the low voltage battery 104. For lead-acid batteries this is typically a Kelvin measurement of the entire module monitoring a single terminal temperature, typically on the positive electrode. This can be direct measurements or communicated over via LIN |
| isoSPI 177 | Communicates cell, brick, pack/string currents, pack voltage, bus voltage and module voltage of the battery pack. Alternative communication means to HV battery packs exist from TI and Maxim and others. |
| Main controller 108 | Monitors and controls the BCD system 100 via a preferred lock-step core that is at least ASIL B rated. See firmware section for more details |

V. Firmware

Below is a list of firmware components that live in the main controller 108. Note that some of these functions can be optionally implemented in hardware or a combination of firmware and hardware. The main controller should be above 180 MHz and be able to control all these functions. A multi-core processor is desirable.

TABLE 4

Firmware (or Hardware) of the Main Controller 108

| Firmware Components | Function |
|---|---|
| BMS LV 122 | Using the LVB V and T 175, and iSensor LVB 102, manages the low voltage battery for health, safety (over-charge/discharge), controls charge/discharge limits, and estimates SOC. |
| BMS HV 124 | Using the HVB V and T 175, and iSensor HVB 146, manages the high voltage battery 112 for health, safety (over-charge/discharge), controls charge/discharge limit, thermal limits, and estimates SOC, and other typical function of a HV BMS 124. |
| OBC 126 | Controls the OBC FETs/IGBT by referencing a current setpoint provided by the wall-power limit and the battery limit. Could be conductive and/or wireless. |
| FC 128 | Manages opening/closing the FC contactors 116 with diagnostics for weld detection. |
| PTC 130 | Determines appropriate torque limits of the powertrain system to control both longitudinal and lateral movements of the car. The main advantage in putting the PTC function in the BCD 100 is that the iSensor HVB 146 is directly measured. Knowing this, the powertrain can be controlled without over-discharging or "over-regenerating" the battery pack. For high powered systems (i.e. Tesla Model S Ludicrous) this is essential as it allows maximum powertrain power without sacrificing battery life. |
| DC-DC 132 | Controls the DC-DC FETs. Because the low-voltage battery is managed here, the BCD 100 can ensure that over-charge will not occur in a functionally safe manner. This is an advantage over other disconnected systems, which require an additional contactor to achieve this function. |
| ampSwitch (firmware)134 | Opening of the switch will be done in hardware. The firmware (block 134) will determine when to safely close the switch.<br>1. The ampSwitch 138 will detects a short on either bus by detecting a voltage drop on either Bus A or Bus B (a controller or simple comparator can be used) or using a comparator of the current sensor outputs. When this happens, the switch 138 will be commanded to open by either the hardware circuit of block 134.<br>2. When voltage returns to normal (>10 V), the ampSwitch 138 will command the DC-DC or alternator to match the battery's voltage. At that point the switch 138 will be re-closed. |

TABLE 4-continued

Firmware (or Hardware) of the Main Controller 108

| Firmware Components | Function |
|---|---|
| | 3. Optionally, a shunt or hall-effect current sensor can be used to detect a short.<br>4. To reduce heat accumulation and keep the switch from failing, the switch will be mounted to the aluminum cold plate/heatsink for improved cooling.<br>5. The accumulation of these ideas can be used to create a simple device that enables redundant low voltage power supplies.<br>By utilizing both current and voltage measurements, the system is more robust and can act quicker than other similar systems. |
| ADC 136 | This module will directly monitor analog signals and employee digital filter techniques for the following signals:<br>1. iSensor X 140, 142 (alternatively, SPI or i2C can be used). This is an advantage of the BCD 100 as it can avoid an expensive CAN-based current sensor. Since the controller will be packaged near the sensor, EMI is less of a concern and direct analog measurement can be used.<br>2. Low voltage battery voltage and temperature sense.<br>3. Pedal monitor position signals of both brake and accelerator pedal. |

VI. Power Electronics

The combination of the OBC and the DC-DC into a common physical package presents a novel way of creating a single power electronics topology to service the requirement that both the OBC and DC-DC provide separately. This can be realized by combining the power magnetics of both converters into a single package.

An OBC must step up the input 'mains' voltage of 110 or 220 VAC to nearly 800 VDC at the battery pack. Because of the increasing losses with increasing input/output gain in a boost topology, a high frequency transformer is utilized in place of a traditional boost converter to step up the voltage. This make galvanic isolation inherent to an efficient OBC. Likewise for similar reasons, a high frequency transformer is utilized in place of a single stage buck converter to step down the voltage in a DC-DC converter. The high frequency transformer used in the DC-DC can be eliminated by adding a tertiary winding to the transformer of the OBC. Doing this also eliminates the dedicated power silicon drive circuitry for the DC-DC transformer. Note that while utilizing the transformer of the OBC for the DC-DC, the DC-DC has two energy sources, the HV battery pack and the AC 'mains' source while the vehicle is plugged in and charging. This is demonstrated in circuit block diagram of FIG. 2.

Figure 2:
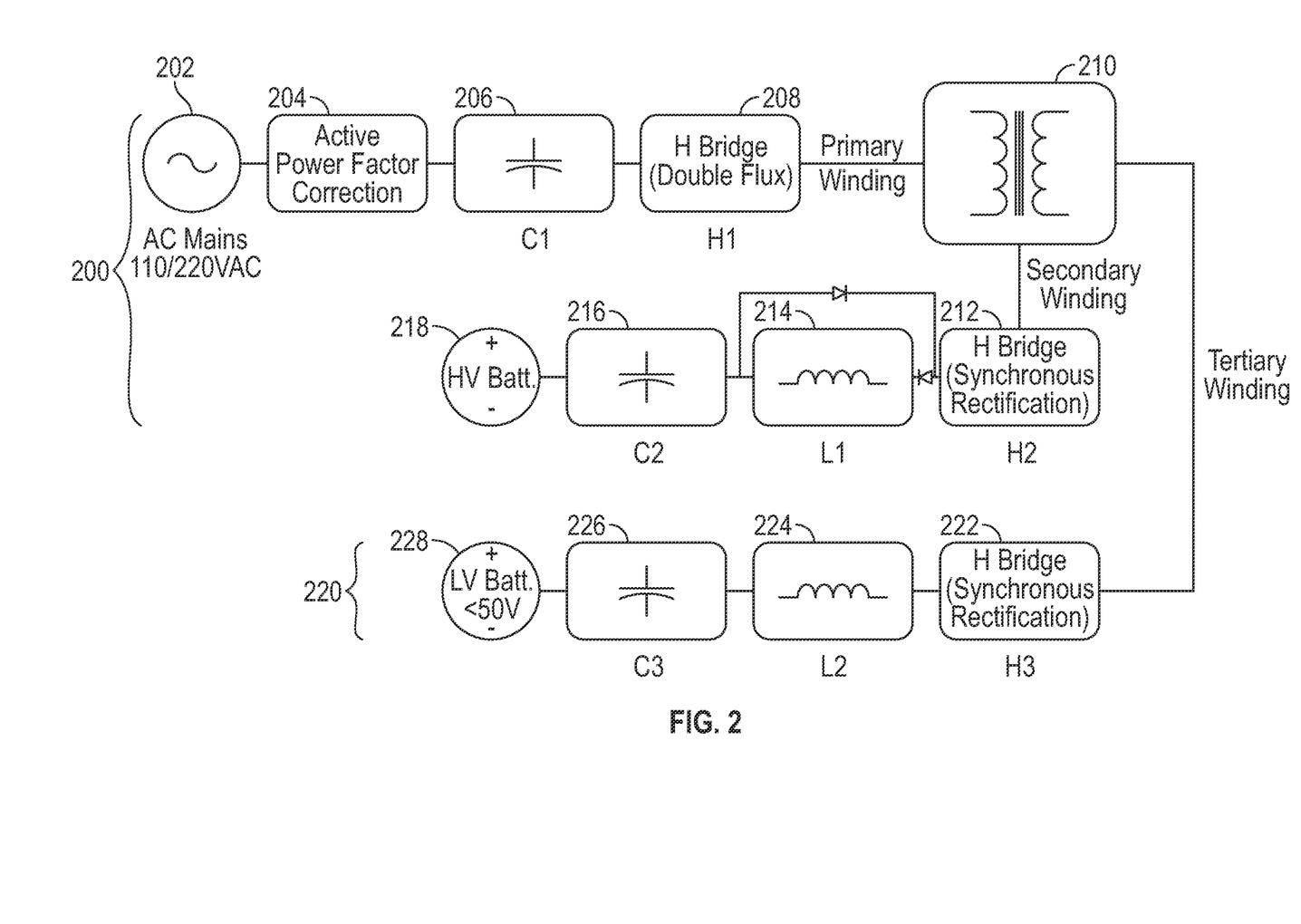
FIG. 2 is a block diagram illustrating the exemplary components of power electronics.

In FIG. 2, the top row represents the OBC 200, with power flow from the AC 'mains' 202 on the left to the battery pack on the right. To reduce the size of the transformer core, the transformer is being driven in both directions to double the flux swing by H-bridge "H1" 208. H-bridge "H2" 212 is a full-bridge active rectification stage followed by a low pass LC filter 214, 216 before the HV battery 218. The second row represents the DC-DC 220, which consists of full bridge rectification in H3 222 with a LC low pass filter 224, 226 on the output. The DC-DC 220 is bi-directional and that allows a second feature to pre-charge the high voltage bus. Normally, the BMS has a precharge relay. This precharge feature comes for free.

There are two modes of power flow for this topology that correspond to when the vehicle is charging and when it is driving. While the vehicle is charging, the LV power bus is supplemented by the DC-DC 220 from the tertiary winding of the OBC transformer. While the vehicle is not in charge mode and is driving the energy source of the DC-DC 220 is then switched to the HV battery system. In this mode of operation, inductor "L1" 214 is decoupled by reverse flow of current (through the diodes or transistors around L1 214), and bridge "H2" 212 used previously for synchronous rectification is now used as the driving circuitry of the transformer.

When combining, the OBC 200 and the DC-DC 220 into a unified power electronics topology, nearly half of the power electronic and magnetic components of the DC-DC 220 are eliminated.

Figure 3:
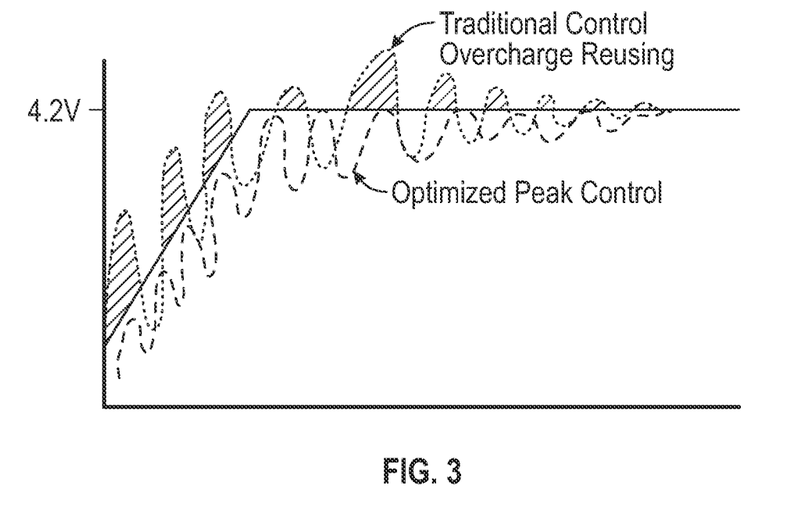
FIG. 3 is an exemplary cell voltage waveform demonstrating ripple while charging, according to an embodiment of the disclosure.

Traditional chargers and DC/DC converters have large output capacitance to minimize current ripple. Current ripple is important to control in traditional systems because the BMS (which regulates charge current) is not integrated and looks at a filtered average current (FIG. 3). In the combined system the BMS can sample the cell voltages at the peaks of the waveform ensuring that we do NOT overcharge the battery, and each cell voltage never rises above its maximum limit. This allows us to reduce the output capacitance by, for example, 20 to 50%. The system knows when to sample the cell voltages at the peaks of the waveform because the voltage sample trigger is synthesized from the OBC's H-bridge PWM carrier frequency, which is all combined into a single system.

VII. Mechanical

Figure 4:
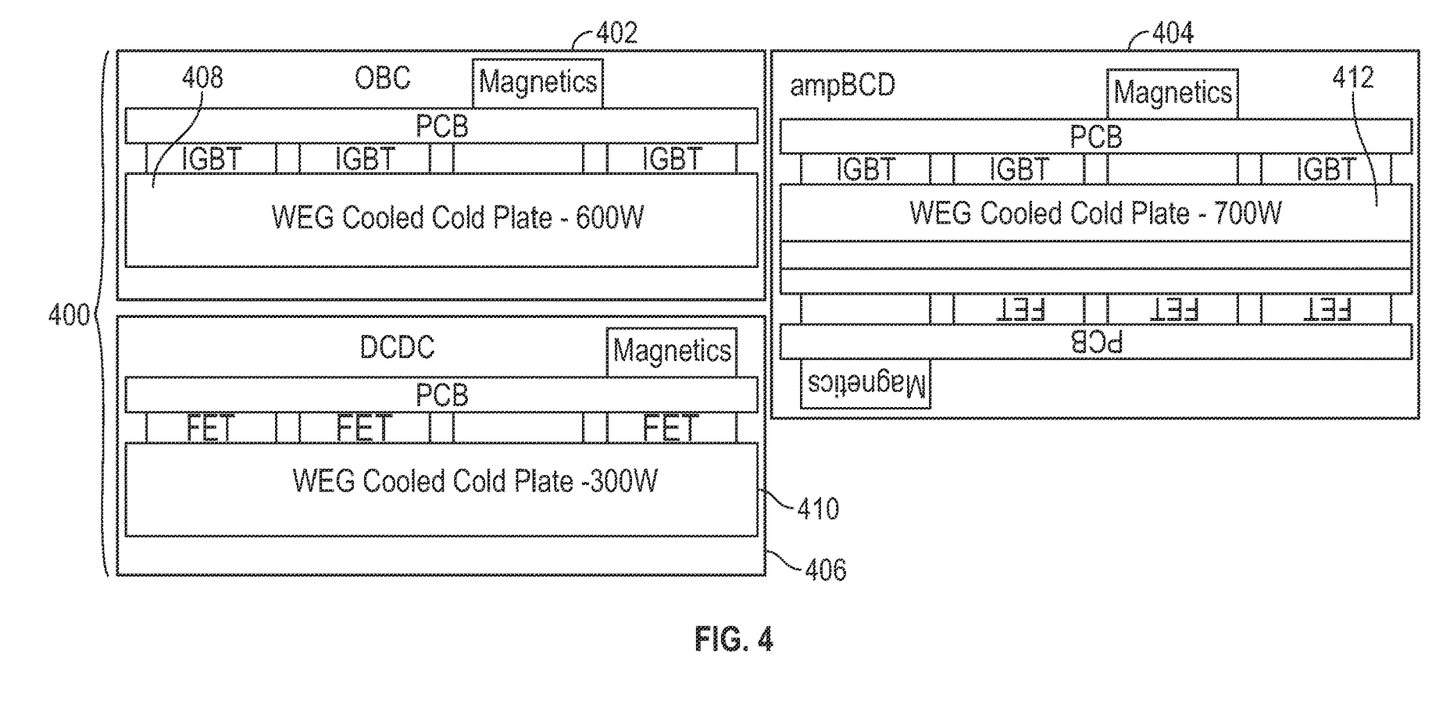
FIG. 4 illustrates a side view of a BCD (i.e., ampBCD), according to an embodiment of the disclosure, compared to a traditional OBC and DC-DC combination.

When the OBC and DC-DC are packaged in the same enclosure, they can share a common cold-plate (water-cooled heat sink). In addition, knowing that the DC-DC and OBC will never be fully on at the same time and generating maximum heat, the shared cold-plate can be downsized. When charging, the DC-DC doesn't need to provide power for heated seats, powered steering, ABS, stability control, etc. which can be several hundreds of watts of additional heat loss. And conversely, when the car is driving and needs the above functions mentioned above, the OBC is off. Therefore, by combining the DC-DC and OBC the heat-sink is reduced in size. FIG. 4 illustrates the two points made above. The traditional separate OBC and DC-DC set-up 400 is illustrated on the left. The traditional set-up 400 requires a cooled cold plate 408 for the OBD 402 and a second cooled cold plate 410 for the DC-DC 406 that is separate from the OBD 402. In contrast, the BCD (or ampBCD) 404 illustrated on the right of FIG. 4 includes a single cooled cold plate 412 shared by the OBD and DC-DC packaged in the same enclosure.

Figure 5:
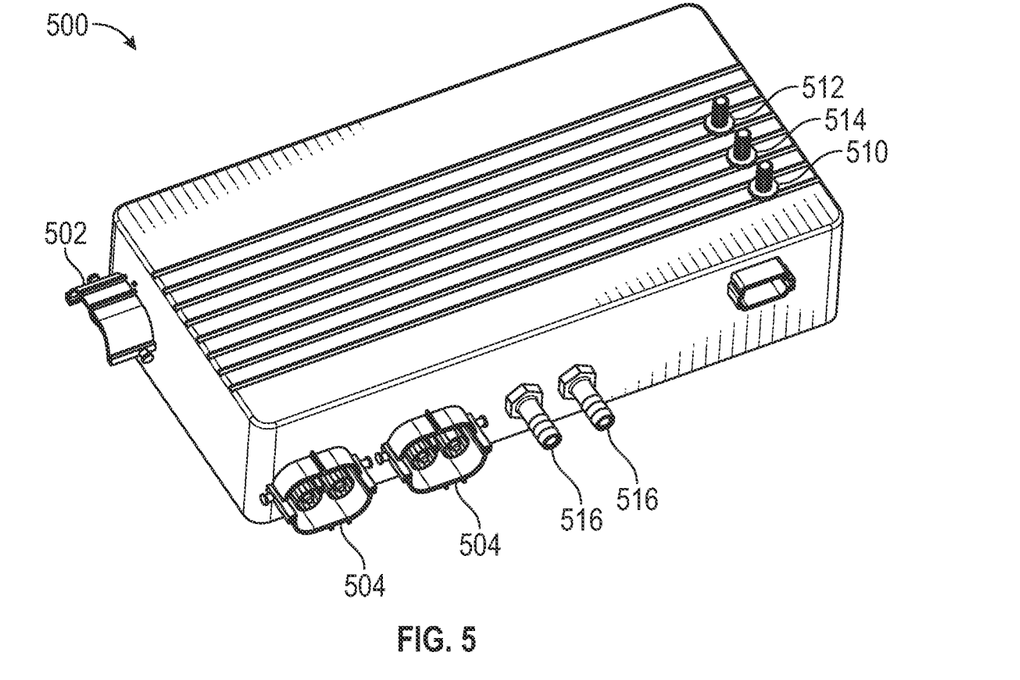
FIG. 5 provides an external view of an BCD, according to an embodiment of the disclosure.

FIG. 5 provides an external view of an exemplary BCD 500. There are at least two high voltage connectors like the Tyco TE line with built-in HVIL for the charge connector 502 and HV out 504. There are three 12V terminal posts for 12V in 510, 12V out A 512, and 12V out B 514. We also have coolant in/out connections 516. Furthermore, for vehicles with multiple inverters or other high voltage loads, additional outputs can be added (FIG. 5).

Figure 6:
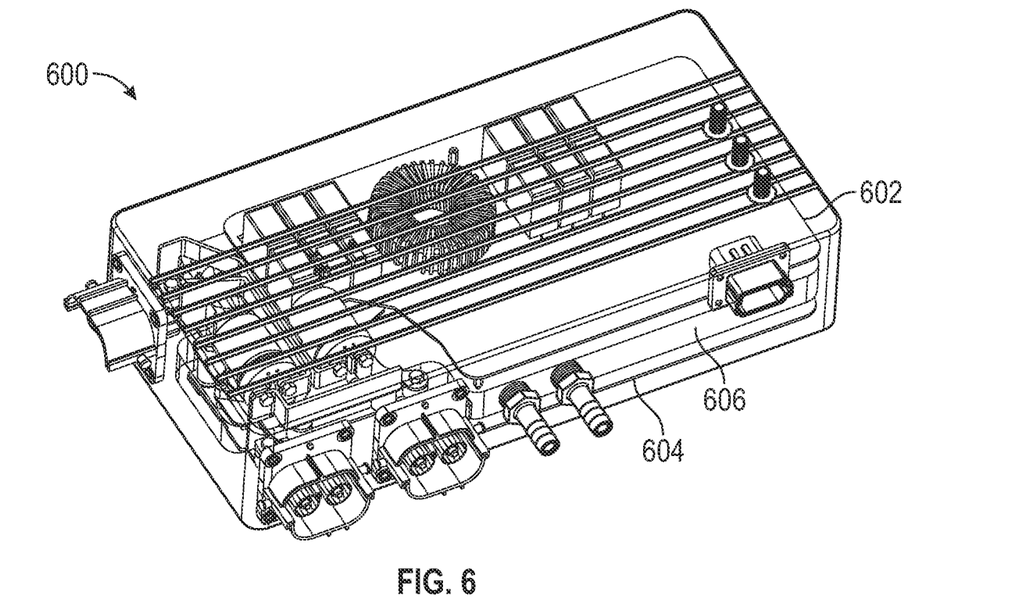
FIG. 6 provides another view of the BCD of FIG. 5, according to an embodiment of the disclosure.

FIG. 6 provides a semi-transparent view of the BCD 600. There are two boards packaged. One contains the OBC board 602, the other is the DC-DC board 604. The controller can live on either board 602, 604. A ribbon cable (not shown) can wrap around the cold plate 606 and handle any board to board communications (FIG. 6).

Figure 7:
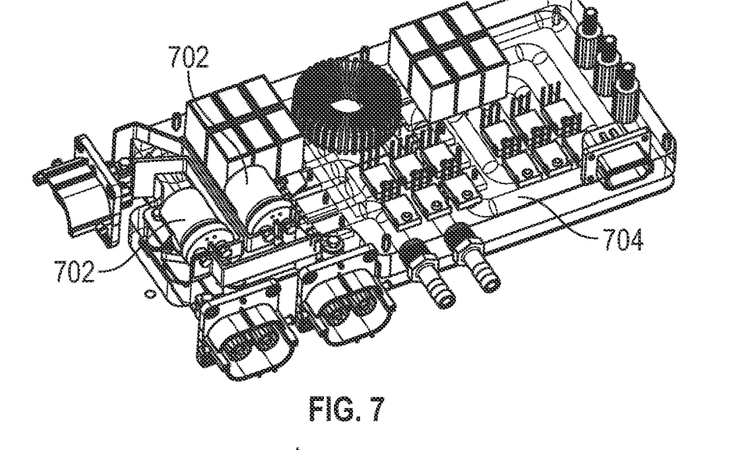
FIG. 7 provides an internal view of the BCD with the top PCB removed, according to an embodiment of the disclosure.
Figure 8:
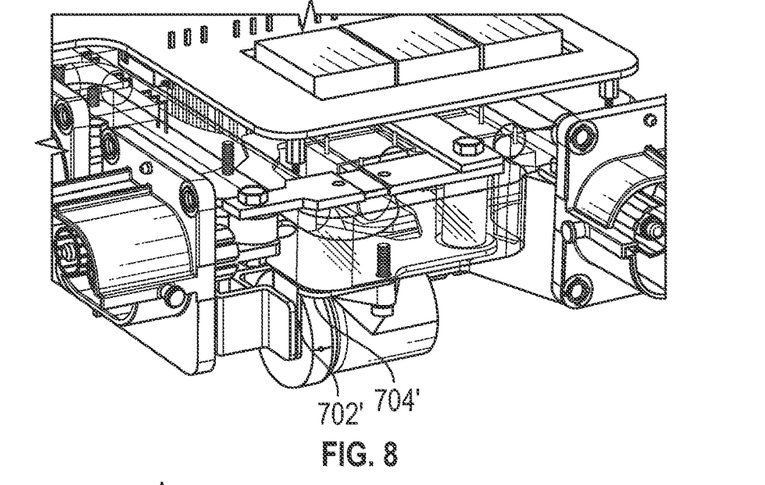
FIG. 8 provides a partial view of the BCD showing a current shunt device and a fast charge contactor thermally coupled to a cold plate, according to an embodiment of the disclosure.

As illustrated in FIG. 7, one bus bar of the contactors 702 used for fast charging can also be thermally coupled to the cool plate 704. The thermal coupling of the electrical devices to the heatsink (bus bars, current sensor, and power transistors can be made using the LOCTITE 315 self-shimming adhesive, suitable for bus voltages up to 1000V, or equivalent (like thermal gap pads). FIG. 8 provides a different view of the same coupling between the contactor bus bar 702' and cool plate 704'.

Figure 9:
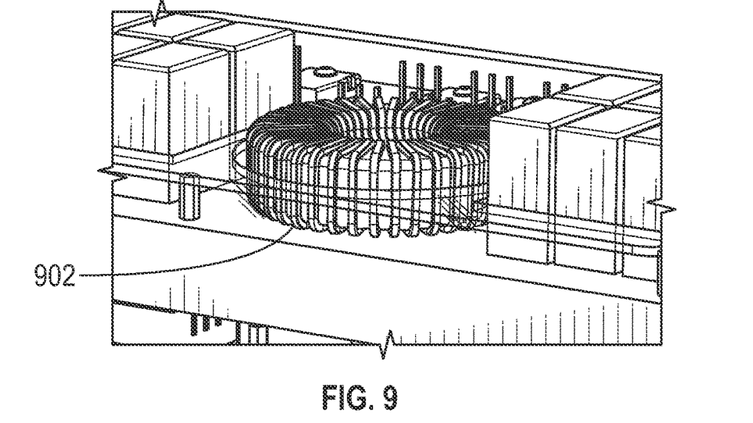
FIG. 9 provides another partial view of the BCD showing large power magnetics components coupled to cold plate using square wire, according to an embodiment of the disclosure.

Further, when the large power magnetic components 902 are wound utilizing a square profile wire, as illustrated in FIG. 9, the power magnetic components can be thermally coupled to the heat sink.

In addition to a reduction in the number of components, the amount of material required for the enclosure is reduced compared to the individual enclosures required for a distributed system.

Another aspect of the disclosure relates to thermal management. The cooling system complexity is reduced by having less hosing and heat-sinking between multiple ECUs. For example, the on-board charger, dc/dc converter, and ampSwitch can all benefit from the same cooling system. Other components such as the current sensor also benefit from additional cooling which results in increased state of charge accuracy by means of higher accuracy current sensing. The mechanical BOM is shown below in Table 5.

TABLE 5

Mechanical Items

| Mechanical BOM | Equivalent Part Number | Description |
| --- | --- | --- |
| Cold Plate | Custom | Two aluminum pieces that are cast and sealed with a gasket. Channels exist to pipe coolant through. Channel width is designed to reduce Eddy currents via best CFD practices. |
| OBC PCB | Custom | |
| DC-DC PCB | Custom | |
| Ribbon Cable | OTS | Connects the two boards together |
| iSense A, B, LBB and HVB | Customer | Manginin and copper mounted against cold-plate bonded by bolt and electrically insulated by Loctite 315 or gap pad |
| FC Contactors | Tyco LEV-100 or equivalent | This a downsized contactor that normally supports 100 A continuous current. By cooling a bus bar connected to the contactor, we have now cooled the contacts and continuously drive current at a much higher value than it is rated for. |
| Magnetics | Custom | Using square wire, thermally bonded to heat sink. The heat sink can have an optional cut-out so the magnetics can sink into the cold-plate/heat-sink. |

TABLE 5-continued

Mechanical Items

| Mechanical BOM | Equivalent Part Number | Description |
| --- | --- | --- |
| HV Connectors | TE Connectivity PN 1-2293575-1 | HV Connectors with built-in HVIL |
| 12 V terminal lug post | | |
| LV connector | | Sealed for low voltage communications and signal ground |

The above embodiments can provide the following technical advantages over existing systems:

1. Integration of one or many of the following components and/or functions into a single box reduces overall packaging volume and weight and cost: HV junction box, HVBMS, OBC, Current Sense, Isolation Switch, PTC, DC/DC, LV-BMS, Fast Charge Contactor Control, CCS/CHAdeMO/J1772/ISO15118/PLC/GBT Charge Controller. This packaging advantage reduces wiring connectors, HV access points, EMI components, power supplies, FR4, processors, communication transceivers and other electrical components and plumbing and coolants connections, coolant power requirements, cold-plate/heat-sink casing material mass.

2. Thermally managed current sensing for increased SOC accuracy. Typically, as the current sensor heats and cools the accuracy goes down. By placing the BMS in the BCD, we already have a cold plate and an easy means to thermally stabilize the shunt which increases its accuracy and leads to an improved SOC estimation over traditional designs. Some other designs use a flux-gate or hall-effect sensor to avoid the thermal drift problem of shunts. However, these sensors are tall and do NOT package well.

3. Low voltage vehicle battery BMS implemented with lithium-ion or lead-acid battery technology is inherent in the Switch design and basically becomes a software component. This eliminates an external IBS mounted in the vehicle usually at the 12V battery terminals.

4. Smaller fast charge contactors through heat-sinking one bus bar through the cold plate/heat sink.

5. Bi-Directional DC/DC provides fails safe limp mode through BMS detection by powering the drive from 12V. This is enabled by combing the HV and LV BMS. This capability is abstracted to the rest of the vehicle, enabling this feature to be seamlessly developed reducing NRE.

6. Dual or more 12V busses powered off one DC/DC reduces volume, weight and cost and achieves functional safety requirements for 12V redundancy features for autonomous vehicles or aircraft or any other electrical system that needs safety critical 12V.

7. Reduced overall vehicle cold-plate/heat-sink mass/volume knowing that the OBC and the DCDC will never be fully on at the same time.

8. Maximizing drive power without over-discharging battery bricks by directly sensing motor current, HV battery current and drive limits algorithm in the BMS by sensing the pedal. This is achieved through low latency measurements which cannot happen through typical CAN and isoSPI busses.

9. By integrating a low voltage BMS and DC-DC, we can protect the low voltage battery from over-charge in a functionally safe manner without adding an additional high-current contactor, which is expensive and takes space. This is especially important for LV lithium batteries which are susceptible to fire when overcharged. The way to stop over-charge is to use a HV over-voltage comparator at the cell or module level and/or safety rated firmware which monitors for overcharge. Once detected the gates of the controller can directly switch off the DC-DC.

10. Avoid CAN or LIN based current sensors by placing the controller near all the current sensors, which are now packaged within the BCD. CAN/Lin based current sensors typically costs a few dollars more (X several in the system). Since the BCD moves the LV and HV BMS within a shielded small box, EMI is less of a concern. This allows the BCD to directly measure across a shunt. Filtering and amplification can be done as normally employed.

11. Autonomous vehicles require 12V redundancy for latitudinal and longitudinal torque required for SAE Level 4 and SAE Level 5 autonomous systems. Traditionally this is achieved by using dual DC/DC converters which create dual 12V systems. A new invention on its own, called an isolation switch (made up of a solid-state switch), can be integrated into the BCD. By integrating this isolation switch into the BCD, an Intelligent Battery Sensor (IBS) firmware function will manage the 12V battery with only the cost of an added current sensor. From the customer's perspective the BCD has dual 12V outputs without out two DCDCs, significantly lowering the cost.

12. Consolidation of high voltage components reduces the total number of HV access point thereby increasing safety and reliability. From a safety perspective, there are less high voltage access points so the complexity of the high voltage interlock loop can be reduced by combing the OBC and DC-DC in one box. This reduces wiring and connector cost as well as improving safety and reliability (through less HVIL connection points). Reliability is improved because isolation leaks paths and interlock connection points in the system are reduced.

13. By managing the LV battery, the LV BMS can selectively choose to discharge the 12V battery in the case that the heat sink/cold-plate thermal loads are too high. This keeps cold-plate/heat-sink under-sized.

14. When the BCD is plumbed on a common cooling loop with other systems that require heat (such as a 'heater core' to heat the passenger cabin or to increase the temperature of a battery pack), the BCD can source heat into the coolant. Power silicon that is arranged into a power-pole topology presently used in the normal functionality of the OBC and DC-DC is used to accomplish this heat generation by driving the power silicon in the linear/ohmic region. Sources for the heat are either of the N high voltage inputs or the OBC AC 'mains'.

15. The combination of the OBC and the DC-DC into a common physical package presents a new opportunity to create a single power electronics topology to service the requirement that both the OBC and DC-DC provide separately. This is realized by combining the power magnetics of both converters into a single package. The high frequency transformer used in the DC-DC is eliminated by adding a tertiary winding to the transformer of the OBC. Doing this also eliminates the dedicated power silicon drive circuitry for the DC-DC transformer. By doing this the DC-DC now has two energy sources, either the HV battery pack while the vehicle is charging or the AC 'mains' voltage while the vehicle is charging.

16. By having the integrated BMS sample the cell voltages at the peak of the waveforms, we can prevent over-charge of the battery cells. This can only be accomplished in a system when the control circuitry of both the BMS and OBC are integrated together, as done here.

17. By having a bi-directional DC/DC, a precharge relay circuit can be eliminated save system costs. The bi-directional DC/DC will be controlled in such away to precharge the inverter and system capacitors before the main battery contactors will be charged.

What is claimed is:

1. A combined battery management system, charger, and direct current converter (BCD) for an electric vehicle, comprising:
    an enclosure enclosing:
        an on board charger (OBC);
        a direct current converter (DC-DC); and
        a single cold plate thermally coupled to both the OBC and the DC-DC, the single cold plate configured to provide cooling for both the OBC and the DC-DC; and
    a plurality of 12V terminal posts on the enclosure, at least one of the plurality of 12V terminal posts for 12V in and at least two of the plurality of 12V terminal posts for 12V outs.

2. The BCD of claim 1 further comprising a first high voltage connector for a charge connector.

3. The BCD of claim 2 further comprising a second high voltage connector for a high voltage (HV) out.

4. The BCD of claim 1 further comprising a coolant in connection and a coolant out connection.

5. The BCD of claim 1 further comprising a controller on the OBC.

6. The BCD of claim 1 further comprising a controller on the DC-DC.

7. The BCD of claim 1 further comprising a ribbon cable that wraps around the single cold plate and configured to handle communications between the OBC and the DC-DC.

8. The BCD of claim 1 wherein the single cold plate can be thermally coupled to a bus bar of contactors used for fast charging.

9. The BCD of claim 1 further comprising power magnetic components that are wound utilizing a square profile wire.

10. The BCD of claim 1, wherein the single cold plate comprising two aluminum pieces sealed with a gasket.

11. The BCD of claim 10, wherein the single cold plate comprising one or more channels to pipe coolant through.

12. The BCD of claim 11, wherein the one or more channels have widths optimized for reducing Eddy currents.

13. The BCD of claim 1 further comprising a low voltage current sensor and a high voltage current sensor.

* * * * *